US007633287B2

(12) United States Patent
Nishiura et al.

(10) Patent No.: US 7,633,287 B2
(45) Date of Patent: Dec. 15, 2009

(54) CURRENT SENSOR

(75) Inventors: Ryuichi Nishiura, Tokyo (JP); Yo Makita, Tokyo (JP); Hiroshi Nishizawa, Tokyo (JP); Tadahiro Yoshida, Tokyo (JP); Tae Hyun Kim, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/255,783

(22) Filed: Oct. 22, 2008

(65) Prior Publication Data

US 2009/0261813 A1 Oct. 22, 2009

(30) Foreign Application Priority Data

Apr. 16, 2008 (JP) ............................. 2008-106715

(51) Int. Cl.

*G01R 15/18* (2006.01)
*G01R 1/20* (2006.01)
*G01R 15/20* (2006.01)
*G01R 19/20* (2006.01)

(52) U.S. Cl. .................... 324/127; 324/126; 324/117 R

(58) Field of Classification Search ................. 324/126, 324/127, 117 R, 244; 336/145
See application file for complete search history.

(56) References Cited

FOREIGN PATENT DOCUMENTS

| | | |
|---|---|---|
| JP | 2004-95935 | 3/2004 |
| JP | 2004-153222 | 5/2004 |
| JP | 2006-24844 | 1/2006 |

OTHER PUBLICATIONS

U.S. Appl. No. 12/092,973, filed May 8, 2008, Nishiura et al.

*Primary Examiner*—Ha Tran T Nguyen
*Assistant Examiner*—Roberto Velez
(74) *Attorney, Agent, or Firm*—Oblon, Spivak, McClelland, Maier & Neustadt, L.L.P.

(57) ABSTRACT

A core is divided by alternately arranging plural magnetic material portions and plural non-magnetic material portions in a circumferential direction of the core through which a primary conductor penetrates. A conductor is wound around the core under conditions in which each core cross section of the core intersects the magnetic material portion and the non-magnetic material portion, each core cross section including a cut end surface of each conductor of a secondary winding wound around the core, and a ratio of a magnetic material portion cross-sectional area of the magnetic material portion to a non-magnetic material portion cross-sectional area of the non-magnetic material portion at the core cross section is kept constant at each core cross section.

10 Claims, 16 Drawing Sheets

CURRENT SENSOR

BACKGROUND OF THE INVENTION

1. Field of the Invention

The present invention relates to a current sensor which measures a current passed through a primary conductor.

2. Description of the Related Art

When a high current is measured, because the direct passage of the high current through an ammeter is dangerous, a current sensor is used to measure the high current. In the current sensor, a primary current is decreased and supplied to a secondary side with a current transformer (CT), thereby measuring a secondary current. The current transformer is formed by utilizing an alternating-current characteristic, and the current transformer has a structure in which the secondary current is taken out from a coil formed by winding a conductor around a core (iron core).

However, even if the high current is measured with the current sensor, sometimes the current is not correctly measured because a magnetic flux generated in the core is saturated. Therefore, in order to suppress the magnetic saturation in the core to enable the correct current measurement, there has been proposed a method of decreasing magnetic flux density in the core by enlarging a cross-sectional area of the core or performing feedback of a CT output (secondary winding) to a tertiary winding (for example, see Japanese Patent Laid-Open Publication No. 2004-153222).

Such as an electric reactor, in a case that evenness of the magnetic flux density in the core becomes insignificant, in order to decrease the magnetic flux in the core, there has been proposed a method adopting a structure in which the core is divided and the divided cores are coupled with a gap inserted therebetween (for example, see Japanese Patent Laid-Open Publication No. 2004-95935). There has also been proposed a method of reducing the saturation of the relative permeability of the magnetic core by utilizing a mixture of magnetic material powders and non-magnetic material powders as the magnetic core (for example, see Japanese Patent Laid-Open Publication No. 2006-024844).

Conventionally, when the high current is measured with the conventional current sensor, it is necessary that the feedback circuit is separately provided in the current sensor in order to suppress the magnetic flux saturation in the core, which causes a problem in that the apparatus configuration is enlarged. Although the method of enlarging the cross-sectional area of the core can be also adopted for suppressing the magnetic flux saturation in the core, because of the enlarged size of the core, the small current sensor is hardly formed.

In the method of dividing the core as the countermeasure for suppressing the magnetic flux saturation, a leakage flux is generated because magnetic resistance is remarkably increased at the gap portion between the divided cores, which causes the decreasing the evenness of the magnetic flux density in the whole circumference of the core. Therefore, unfortunately the measurement accuracy of the current sensor is lowered.

In the method disclosed in Japanese Patent Laid-Open Publication No. 2006-024844, in which the saturation of the relative permeability of the magnetic core is relaxed by utilizing the mixture of magnetic material powders and non-magnetic material powders as the magnetic core, since the relative permeability is changed for a magnetic field, unfortunately sensitivity is changed when the magnetic core of the mixture is adopted for the current sensor.

SUMMARY OF THE INVENTION

In view of the foregoing, an object of the present invention is to provide a current sensor which can maintain the measurement accuracy to measure the high current with a core smaller than conventional one without providing the feedback circuit.

In order to attain the above object, the present invention is configured as below.

In accordance with one aspect of the present invention, a current sensor which measures a primary current by an output of a secondary winding, comprising: a core which has a penetration portion in a central portion thereof and collects magnetic flux generated by the primary current passing through a primary conductor, the primary conductor being disposed while penetrating through the central portion; and a secondary winding which is wound in a toroidal form around a body portion of the core and detects a change of the magnetic flux in the core, the core further including: a plurality of magnetic material portions made of a magnetic material and configured to divide the core in a circumferential direction of the core; and a plurality of non-magnetic material portions made of a non-magnetic material and configured to divide the core in the circumferential direction of the core, the magnetic material portions and the non-magnetic material portions being alternately arranged over a whole circumference of the core, and the secondary winding being wound around the body portion of the core under conditions in which each core cross section intersects the magnetic material portion and the non-magnetic material portion, each core cross section being of a cutting plane in the core and including a cut end surface of each conductor along a direction in which each conductor constituting the secondary winding is extended, and a ratio of a magnetic material portion cross-sectional area of the magnetic material portion to a non-magnetic material portion cross-sectional area of the non-magnetic material portion at the core cross section is kept constant in each core cross section.

In the current sensor, the core may include a plurality of divided cores having an identical shape and configured to form the core by overlapped mutually. The divided cores differ from each other in a ratio of the magnetic material portion cross-sectional area to the non-magnetic material portion cross-sectional area at the core cross section of the divided core, and the secondary winding may be wound around the body portion of the core formed by overlapping the divided cores according to the conditions.

Also, in the current core, the magnetic material portion in the core may be formed on a core pattern board with a patterning, the core pattern board being made of the non-magnetic material and having a through-hole through which the primary conductor penetrates. In this aspect, the current core may further comprise two or more core pattern boards in which the pattern of the magnetic material portion is formed, wherein the core is formed by laminating the core pattern boards. Further, the pattern of the magnetic material portion may be formed on the core pattern board by the electrolytic plating.

Also, in the current core, the conductor constituting the secondary winding may be configured: to be formed on a first winding pattern board with a patterning, the first winding pattern board made of the non-magnetic material and having a through-hole through which the primary conductor penetrates; to be formed on a second winding pattern board with a patterning, the second winding pattern board made of the non-magnetic material, having the through-hole through which the primary conductor penetrates, and sandwiching the core between the first winding pattern board and the second winding pattern board; and to have a connection conductor which electrically connects a first conductor formed on the first winding pattern board and a second conductor formed on the second winding pattern board.

Also, the current core may further comprise a turn-back conductor configured to be formed by turning back the secondary winding wound in the toroidal form around the body portion of the core, and provided at the body portion along a direction in which the turn-back conductor cancels an influence of an inclination of the secondary winding wound around the body portion with respect to the primary conductor.

Also, in the current core, the non-magnetic material portion may be formed by a non-magnetic material member in which a fitting portion is formed, the magnetic material portion being fitted in the fitting portion.

Also, in the current core, the core may be formed by deforming a linearly-formed non-magnetic material portion or a linearly-formed magnetic material portion into an annular shape. Wherein, the core may be formed by molding the circularly-deformed magnetic material portion with the non-magnetic material, the non-magnetic material portion being made of the non-magnetic material.

In the current sensor according to one aspect of the present invention, the core includes the magnetic material portion and the non-magnetic material portion, and the core is divided into a lot of parts in the circumferential direction of the core by the magnetic material portion and the non-magnetic material portion. In the configuration of the current sensor according to the aspect of the present invention, the non-magnetic material portion has the remarkably large magnetic resistance, so that the magnetic flux passing through the core can be decreased to suppress the magnetic flux saturation in the core. Accordingly, the provision of the feedback circuit is eliminated, and higher current than the conventional art can be measured with the core having the same size as conventional one. Conversely, the high current can be measured with the core smaller than conventional one.

On the other hand, when the core is simply divided without any conditions, the leakage flux is generated from the cross section at the divided portion to lose the evenness of the magnetic flux density in the whole circumference of the core, which lowers the current measurement accuracy. On the other hand, according to the current sensor according to one aspect of the present invention, the conductor is wound around the core under the conditions in which each core cross section intersects the magnetic material portion and the non-magnetic material portion, each core cross section including the cut end surface of each conductor constituting the secondary winding, and the ratio of the magnetic material portion cross-sectional area of the magnetic material portion to the non-magnetic material portion cross-sectional area of the non-magnetic material portion at the core cross section is kept constant in each core cross section. Therefore, the magnetic flux density at the core cross section can be uniformed in each conductor which is a detection unit, and the decrease in measurement accuracy caused by dividing the core can be suppressed, so that the measurement accuracy in the current sensor is not lowered. Accordingly, while the current measurement accuracy is maintained, the high current can be measured with the current sensor in which the small core is used.

DETAILED DESCRIPTION OF THE PREFERRED EMBODIMENTS

Figure 1:
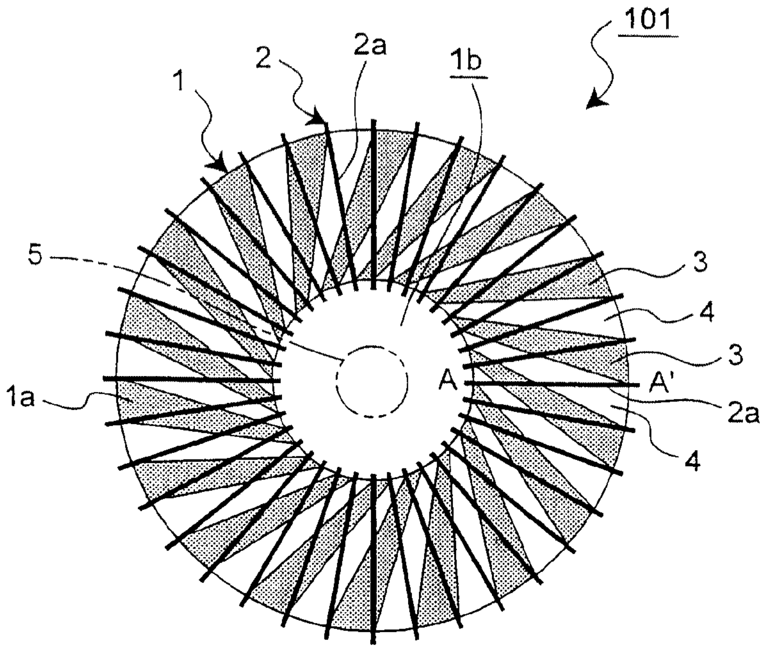
FIG. 1 is a plan view showing a current sensor according to a first embodiment of the present invention.
Figure 2:
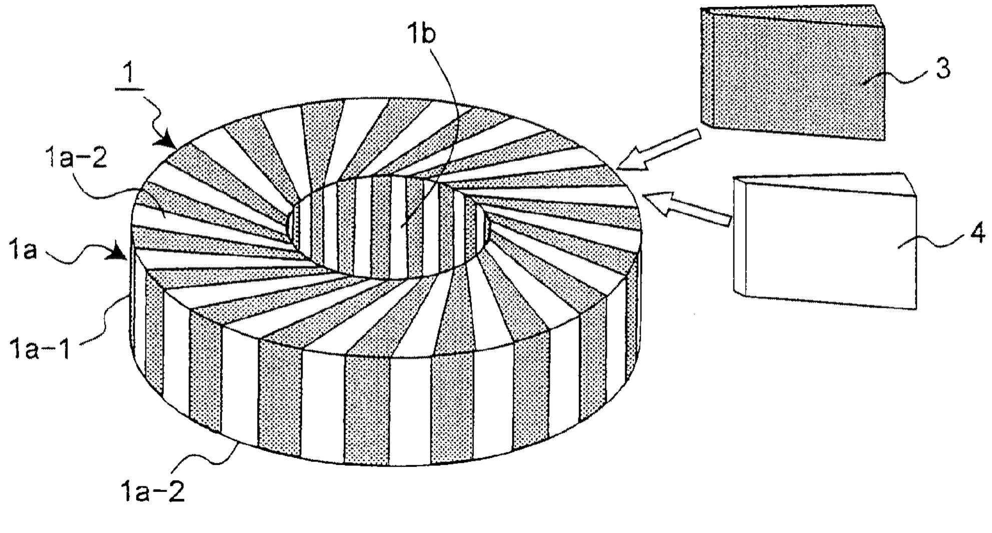
FIG. 2 is a perspective view showing a core constituting the current sensor of FIG. 1.

A current sensor according to an exemplary embodiment of the present invention will be described below with reference to the accompanying drawings. In the drawings, components having the same or similar function are designated by the same numeral. Usually the current sensor is called Current Transformer (CT), and measures a primary current passing through a primary conductor which is disposed while penetrating through a central portion of the current sensor.

First Embodiment

A current sensor 101 according to a first embodiment of the present invention will be described with reference to FIGS. 1 to 3, 4A, and 4B. As shown in FIG. 1, the current sensor 101 includes a core 1 and a secondary winding 2.

The core 1 has a body portion 1*a* and a through-hole. The body portion 1*a* is formed into an annular shape like a pipe ring. The through-hole is made in a central portion 1*b* of the current sensor 101. The body portion 1*a* includes a circumferential surface 1*a*-1 and upper and lower surfaces 1*a*-2. In the first embodiment, the upper and lower surfaces 1*a*-2 are formed by flat surfaces respectively. Alternatively the upper and lower surfaces 1*a*-2 may be formed into a projected shape such as a semicircular shape and the like. A primary conductor 5 for passing the primary current which corresponds to a current to be measured is disposed along the central portion 1*b*, namely, the primary conductor 5 is disposed while penetrating through the core 1.

Figure 3:
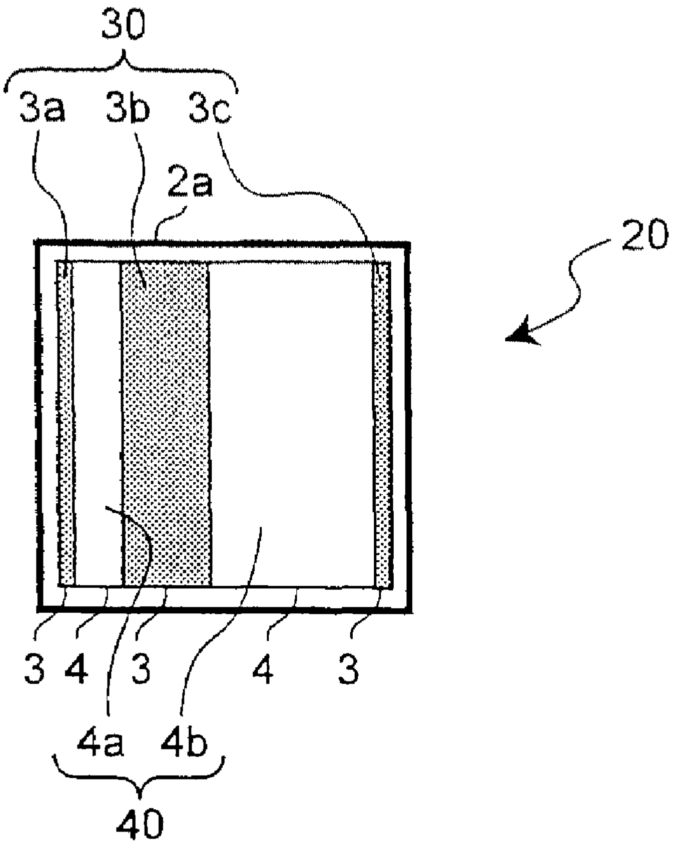
FIG. 3 is a sectional view taken on a line A-A' of FIG. 1.

The core 1 also includes plural magnetic material portions 3 and plural non-magnetic material portions 4. The magnetic material portion 3 is made of a magnetic material. The core 1 is divided in the circumferential direction by the plural magnetic material portions 3. In the first embodiment, the non-magnetic material portion 4 has the same shape as the magnetic material portion 3, and is made of a non-magnetic material. The core 1 is divided in the circumferential direction by the plural non-magnetic material portions 4. The magnetic material portions 3 and the non-magnetic material portions 4 are alternately coupled and evenly arranged over the whole circumference of the core 1. For example, the core 1 is formed by tens to hundreds magnetic material portions 3 and non-magnetic material portions 4. In the first embodiment, the magnetic material portion 3 and the non-magnetic material portion 4 are formed into the same shape. However, as described later with reference to FIG. 3, it is not always necessary that the magnetic material portion 3 and the non-magnetic material portion 4 are formed into the same shape, as long as a ratio of a magnetic material portion cross-sectional area of the magnetic material portion 3 to a non-magnetic material portion cross-sectional area of the non-magnetic material portion 4 is kept constant at each core cross section. In the current sensor 101 of FIG. 1, the magnetic material portion 3 and the non-magnetic material portion 4 are spirally arranged as shown in the drawing.

The secondary winding 2 is used to detect a change in magnetic flux which is generated in the core 1 by the primary conductor 5, and the current sensor 101 measures the primary current from an output of the secondary winding 2. In the secondary winding 2, a conductor 2*a* is wound in a toroidal form around the whole circumference of the core 1 along a surface of the body portion 1*a* of the core 1 while the following conditions are satisfied. In the first embodiment, the conductor 2*a* is extended along a radial direction of the core 1 in the upper and lower surfaces 1*a*-2 of the body portion 1*a* according to the shapes and arrangement of the magnetic material portions 3 and non-magnetic material portions 4.

In order to secure required accuracy in detecting the primary current, it is necessary that the secondary winding 2 is evenly wound over the whole circumference of the core 1. That is, attention is focused on a cutting plane of the core 1 including a cut end surface of each conductor 2*a* along the extending direction of each conductor 2*a* constituting the secondary winding 2, that is, each core cross section 20 shown in FIG. 3 which is of a cross section of the core 1 taken on a line A-A' shown in FIG. 1. The conductor 2*a* is wound around the core 1 to form the secondary winding 2 such that the following conditions are satisfied. That is, each core cross section 20 corresponding to each conductor 2*a* intersects the magnetic material portion 3 and the non-magnetic material portion 4, and the ratio of the magnetic material portion cross-sectional area of the magnetic material portion 3 to the non-magnetic material portion cross-sectional area of the non-magnetic material portion 4 at the core cross section 20 is kept constant, that is, the same in each core cross section 20. For the core cross section 20 shown in FIG. 3, the magnetic material portion cross-sectional area is a cross-sectional area 30 in which cross-sectional areas 3*a*, 3*b*, and 3*c* of the magnetic material portion 3 are added, and the non-magnetic material portion cross-sectional area is a cross-sectional area 40 in which cross-sectional areas 4*a* and 4*b* of the non-magnetic material portion 4 are added. In each core cross section 20 of each conductor 2*a*, a shape of the magnetic material portion 3 differs from a shape of the non-magnetic material portion 4 in the sectional shape cut by each core cross section 20. However, the conductor 2*a* is disposed relatively in relation to the magnetic material portion 3 and the non-magnetic material portion 4. Specifically, the shapes and arrangement of the magnetic material portion 3 and the non-magnetic material portion 4 are adjusted relatively with respect to the conductor 2*a* such that the ratio of the magnetic material portion cross-sectional area 30 to the non-magnetic material portion cross-sectional area 40 is kept constant at each core cross section 20.

Figure 4A:
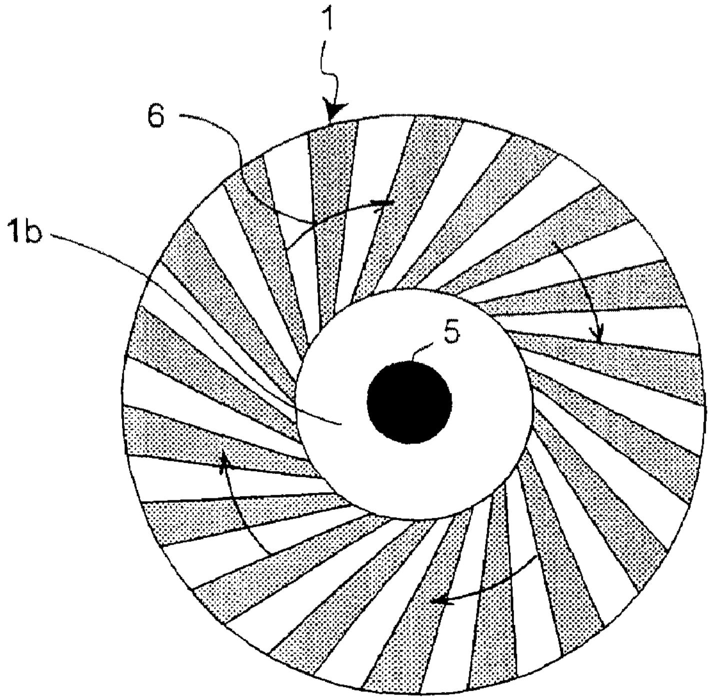
FIG. 4A shows a concept of a magnetic flux distribution in the current sensor of FIG. 1.
Figure 4B:
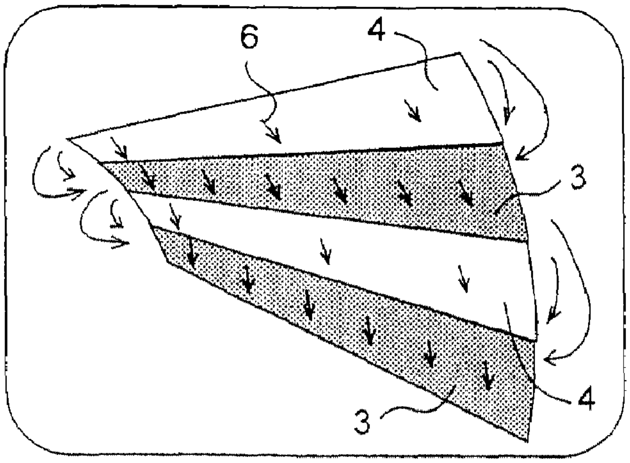
FIG. 4B shows a concept of a magnetic flux distribution in the current sensor of FIG. 1.

The following effect is obtained when the conductor 2*a*, and the magnetic material portion 3 and the non-magnetic material portion 4 are relatively disposed such that the above mentioned conditions are satisfied. As shown in FIG. 4A, when the current passes through the primary conductor 5 penetrating through the core 1, a magnetic flux 6 is generated in the circumferential direction of the primary conductor 5 according to the current. At this point, when the core 1 having the above mentioned conditions is adopted, as shown in FIG. 4B, the magnetic flux 6 is collected from the circumference into the magnetic material portion 3 having a high permeability, while in a space portion which is of the non-magnetic material portion 4, the magnetic flux 6 is diffused because the non-magnetic material portion 4 has the permeability close to surrounding air. Therefore, uneven density of the magnetic flux 6 is generated in the core 1.

However, when the above mentioned conditions are satisfied, the sum of the magnetic flux density passing through each core cross section 20 is equalized to uniform an electromotive force generated by electromagnetic induction. Therefore, the decrease in primary current detection accuracy can be suppressed in the current sensor 101.

Since the core 1 is formed by the magnetic material portion 3 and the non-magnetic material portion 4, the non-magnetic material portion 4 has the extremely large magnetic resistance. Therefore, the magnetic flux passing through the core 1 can be decreased to suppress the magnetic flux saturation in the core 1. Accordingly, the provision of the feedback circuit is eliminated, and the higher current can be measured with the core having the same size as conventional one.

Compared with a so-called hollow current sensor (such as a Rogowski coil), the current sensor 101 of the first embodiment has high sensitivity because the magnetic material portion 3 having the high permeability exists inside the secondary winding 2.

Compared with a so-called iron-core current sensor in which a core is formed only by the magnetic material, in the current sensor 101 of the first embodiment, because the non-magnetic material portion 4 having the low permeability exists in the core 1, the magnetic saturation of the core 1 can be suppressed to broaden a measurement range.

In the current sensor 101 of the first embodiment, since the magnetic saturation of the core 1 can be suppressed, it is not necessary to take the magnetic saturation countermeasure in the conventional current sensor, that is, it is not necessary to enlarge the core size. Therefore, the current sensor size can significantly be miniaturized.

As described above, both the magnetic material portion 3 having the high permeability and the non-magnetic material portion 4 having the low permeability are arranged in the current sensor 101 of the first embodiment, so that the magnetic resistance in the core 1 can arbitrarily be controlled to adjust the current sensor to the sensitivity corresponding to the measured primary current.

As long as the conditions mentioned above are satisfied in the core cross section 20, the shapes and arrangement of the magnetic material portion 3 and non-magnetic material portion 4, and a method of winding the conductor 2*a* are not limited to the modes shown in FIG. 1, but various modifications can be made as follows.

Figure 5:
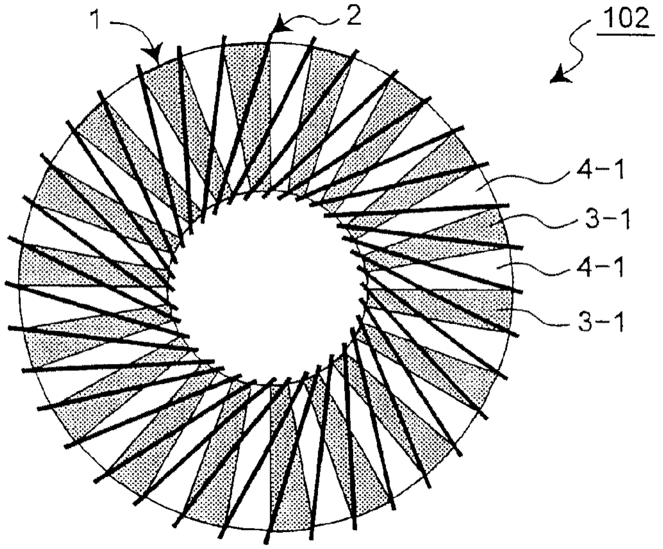
FIG. 5 is a plan view showing a modification of the current sensor of FIG. 1.

For example, in a current sensor 102 shown in FIG. 5, magnetic material portions 3-1 and non-magnetic material portions 4-1 may be radially formed and arranged along the radial direction of the core 1, and the conductor 2*a* may be spirally disposed in the spiral shape on the upper and lower surfaces 1*a*-2 of the body portion 1*a*. In the configuration of FIG. 5, advantageously the shapes of the magnetic material portion 3-1 and non-magnetic material portion 4-1 are simplified compared with the magnetic material portion 3 and non-magnetic material portion 4 of FIG. 1, which facilitates the production of the core 1.

Figure 6:
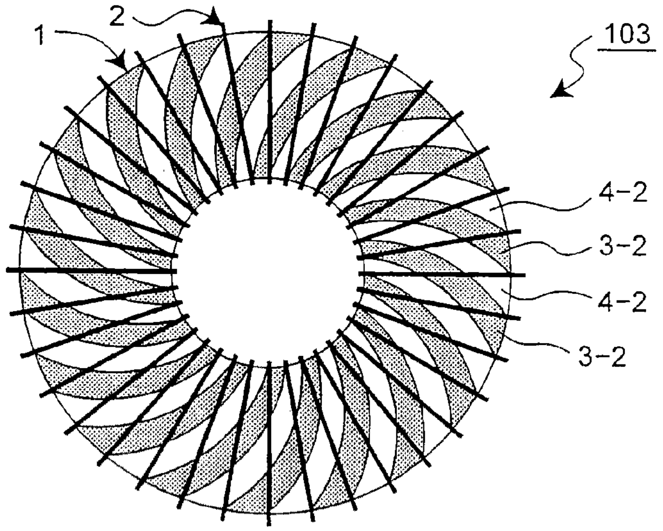
FIG. 6 is a plan view showing another modification of the current sensor of FIG. 1.

In a current sensor 103 shown in FIG. 6, magnetic material portions 3-2 and non-magnetic material portions 4-2 may be helically formed, and the conductor 2*a* may be extended along the radial direction of the core 1 on the upper and lower surfaces 1*a*-2 of the body portion 1*a*. In the configuration of FIG. 6, although the shapes of the magnetic material portion 3-2 and non-magnetic material portion 4-2 are complicated compared with the configuration of FIG. 5, advantageously the winding of the conductor 2*a* becomes easy because it is only necessary to extend the conductor 2*a* of the secondary winding 2 along the radial direction of the core 1.

Figure 7:
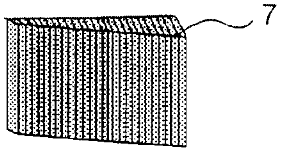
FIG. 7 is a perspective view showing a magnetic material portion constituting the core of the current sensor of FIG. 1 in a case in which the magnetic material portion is made of magnetic material foil.

In the magnetic material portions 3, 3-1, and 3-2, similarly to an eddy current countermeasure in the production of the core of the general current sensor, as shown in FIG. 7, pieces of magnetic material foil whose surfaces are electrically insulated are laminated, and the core is divided in the radial direction of the core to be able to form an electrically-insulated magnetic material portion 7. FIG. 7 shows the magnetic material portion 7 used in the current sensor 101.

Figure 8:
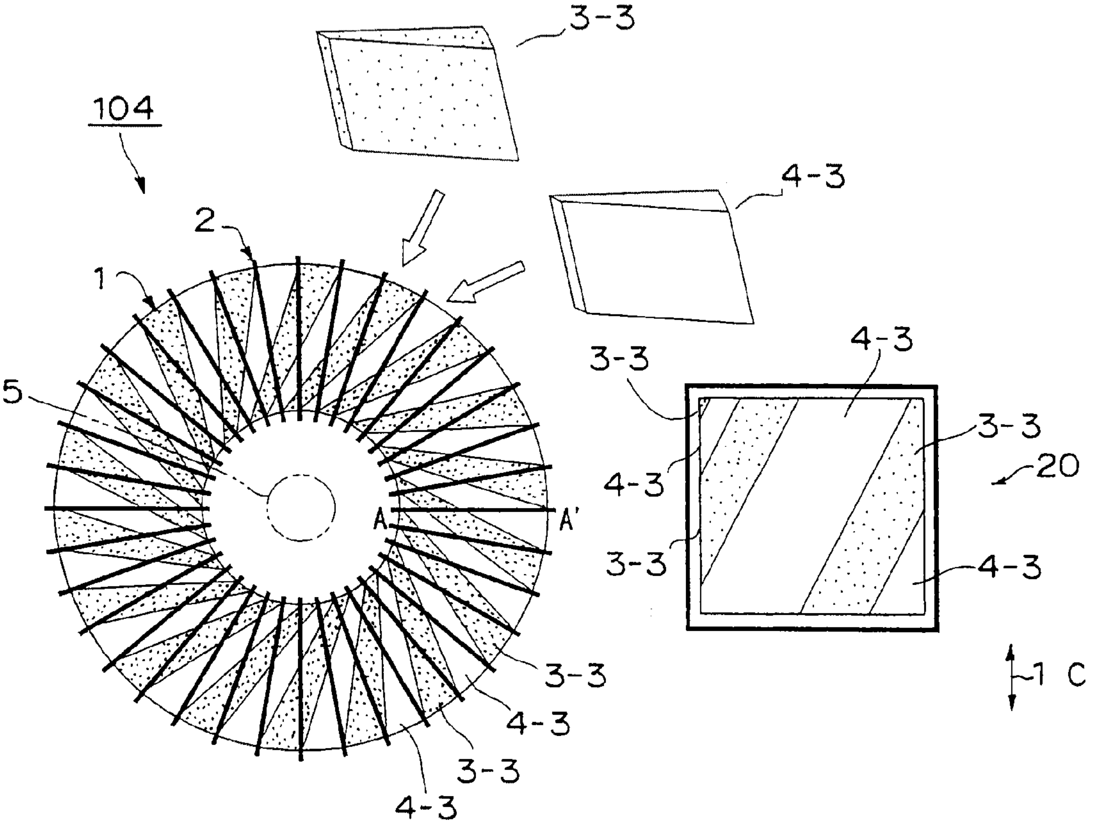
FIG. 8 shows still another modification of the current sensor of FIG. 1, which has a configuration in which a magnetic material portion and a non-magnetic material portion are inclined at a core cross section.

In a current sensor 104 shown in FIG. 8, although the arrangement of magnetic material portions 3-3, non-magnetic material portions 4-3, and the conductor 2*a* is similar to that of the current sensor 101 of FIG. 1, the magnetic material portions 3-3 and non-magnetic material portions 4-3 at the core cross section 20 may be arranged while inclined with respect to an axial direction 1*c* of the core 1.

Figure 9:
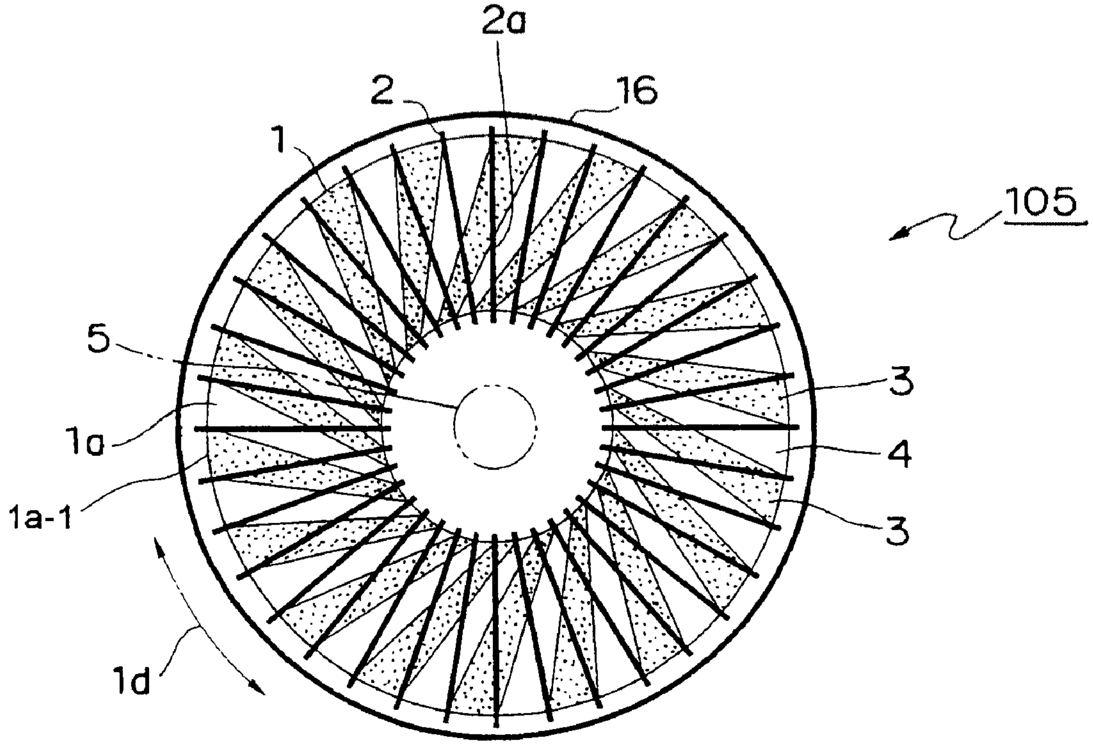
FIG. 9 is a plan view showing still another modification of the current sensor of FIG. 1.

A current sensor 105 having a turn-back conductor 16 can be formed as shown in FIG. 9. The turn-back conductor 16 is a conductor portion which is formed by turning back the conductor 2*a* of the secondary winding 2 in the toroidal form disposed around the whole circumference of the body portion 1*a* of the core 1. The turn-back conductor 16 is provided on the body portion 1*a* along a direction in which the turn-back conductor 16 cancels out an influence of an inclination of the secondary winding 2 wound around the body portion 1*a* with respect to the primary conductor 5. In an example shown in FIG. 9, the conductor 2*a* is turned back while the turn-back conductor 16 is connected to the toroidally-shaped conductor 2*a* of the secondary winding 2, and the turn-back conductor 16 is extended one round so as to face the circumferential surface 1*a*-1 of the body portion 1*a* along the circumferential direction 1*d* of the core 1. A length of the one round conductor constituting the turn-back conductor 16 corresponds to a total length of the conductor 2*a* of the toroidally-shaped secondary winding 2 around the body portion 1*a*. The turn-back conductor 16 is electrically insulated from the toroidally-shaped conductor 2*a* around the body portion 1*a*.

FIG. 9 shows the configuration of the turn-back conductor 16 only by way of example. As described above, it is only necessary to provide the turn-back conductor 16 with the length corresponding to the total length of the secondary winding 2 in the toroidal form. For example, the toroidally-shaped conductor 2*a* around the body portion 1*a* is turned back and wound in the toroidal form around the body portion 1*a* in the reverse direction, and then the turn-back conductor 16 may be formed.

Thus, the influence of the inclination of the primary conductor 5 relative to the core 1 on the secondary winding 2 can be canceled by providing the turn-back conductor 16.

Second Embodiment

Figure 10:
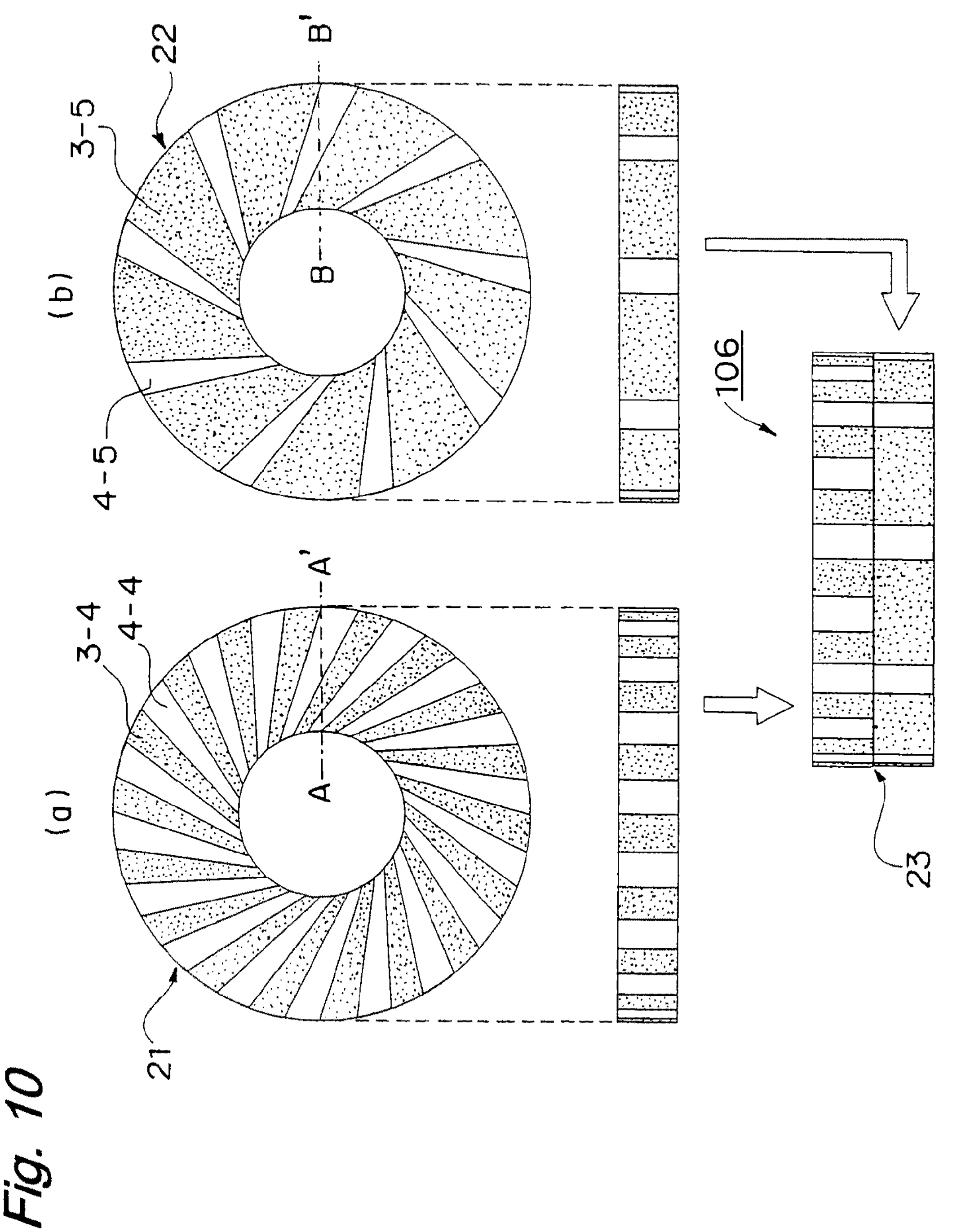
FIG. 10 is a plan view showing a current sensor according to a second embodiment of the present invention.

A current sensor 106 according to a second embodiment of the present invention will be described below with reference to FIG. 10. In FIG. 10, only a core portion constituting the current sensor 106 is shown while the secondary winding 2 is omitted.

In the first embodiment mentioned above, the core 1 is formed by the one structure in which the magnetic material portion 3 and the non-magnetic material portion 4 are integrally formed. On the other hand, in the current sensor 106 of the second embodiment, a core 1 includes plural (two in the second embodiment) divided cores 21 and 22. The second embodiment differs from the first embodiment in this point. The plural divided cores are combined to form the one core 1, which allows a distribution having any sensitivity coefficient to be obtained as a current sensor characteristic.

Regarding other configurations and modifications of the current sensor 106, since the explanation for the first embodiment mentioned above can be applied to the current sensor 106, the description of them is omitted.

The divided cores 21 and 22 will further be described in detail. In the core 1 of the first embodiment, the magnetic material portion 3 and the non-magnetic material portion 4 have the same shape, and are arranged alternately and evenly over the whole circumference of the core 1, thereby controlling the sensitivity of the current sensor. The non-magnetic material portion 4 is made of the non-magnetic material, and is used to provide a gap region between the magnetic material portions 3. On the other hand, in the second embodiment, plural divided cores having different sensitivity characteristics are produced and brought together, and the secondary winding 2 is wound around the brought divided cores to obtain any sensor characteristic.

In the second embodiment, the divided cores 21 and 22 are the annularly-formed and have the same shape, and are overlapped each other in a thickness direction thereof to form the one core. The core formed by the divided cores 21 and 22 is referred to as core 23.

As shown in FIG. 10(*a*), in the divided core 21, low-sensitivity setting magnetic material portions 3-4 and low-sensitivity setting non-magnetic material portions 4-4 are alternatively arranged along the circumferential direction of the divided core 21. In a design of the low-sensitivity setting magnetic material portion 3-4 and the low-sensitivity setting non-magnetic material portion 4-4, a proportion of a region of the magnetic material portion 3 is decreased in the whole circumference such that a sensitivity of the divided core 21 is relatively lowered.

As shown in FIG. 10(*b*), in the divided core 22, high-sensitivity setting magnetic material portions 3-5 and high-sensitivity setting non-magnetic material portions 4-5 are alternatively arranged along the circumferential direction of the divided core 22. In a design of the high-sensitivity setting magnetic material portion 3-5 and the high-sensitivity setting non-magnetic material portion 4-5, a proportion of a region of the magnetic material portion 3 is increased in the whole circumference such that the sensitivity of the divided core 22 is relatively increased.

Thus, the core 23 is formed by overlapping the divided core 21 having the relatively low sensitivity and the divided core 22 having the relatively high sensitivity in the thickness direction thereof, and the secondary winding 2 is wound around the core 23. That is, the divided core 21 differs from the divided core 22 in the proportion of the magnetic material portion and the non-magnetic material portion, and the magnetic flux density is changed in each divided core. Because the secondary winding is wound around the core collectively formed by the divided cores, the current sensor having the sensor characteristic in which the sensitivity coefficient is changed in a multi-step manner according to the primary current can be formed to freely set a sensitivity curve of the current sensor.

The situation that the divided cores 21 and 22 differs from each other in the ratio of the magnetic material portion cross-sectional area 30 to the non-magnetic material portion cross-sectional area 40 at the core cross sections 20 of the divided cores 21 and 22 will be described by taking the core cross section 20 of the first embodiment described above with reference to FIG. 3.

Figure 11A:
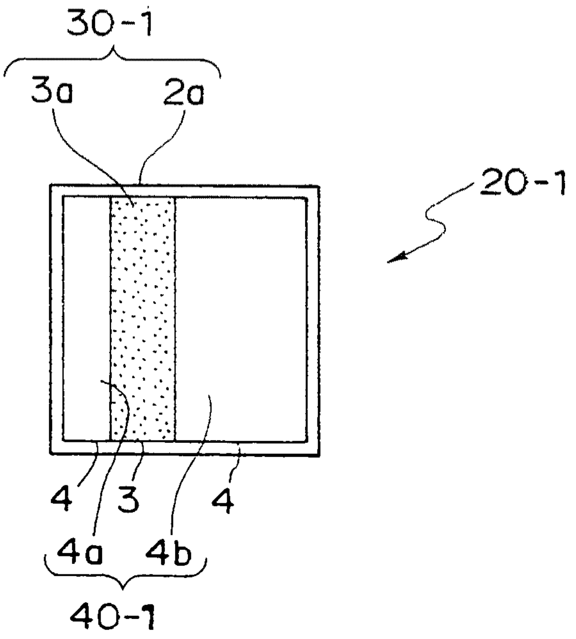
FIG. 11A is a sectional view showing a core cross section taken on a line A-A' of FIG. 10(*a*)
Figure 11B:
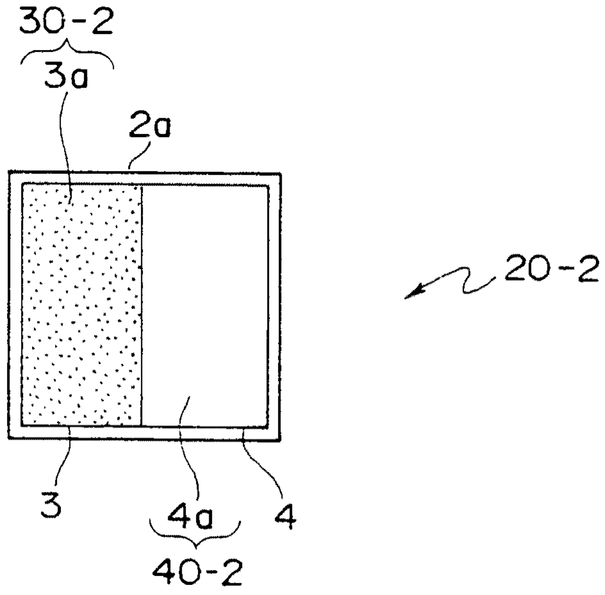
FIG. 11B is a sectional view showing a core cross section taken on a line B-B' of FIG. 10(*b*)

Namely, a line A-A' of FIG. 10(*a*) corresponds to one portion where the conductor 2*a* of the secondary winding 2 is located on the divided core 21, and the core cross section 20 of the divided core 21 at the line A-A' is referred to as core cross section 20-1 as shown in FIG. 11A. The magnetic material portion cross-sectional area 30 at the core cross section 20-1 is referred to as magnetic material portion cross-sectional area 30-1, and the non-magnetic material portion cross-sectional area 40 at the core cross section 20-1 is referred to as non-magnetic material portion cross-sectional area 40-1. Similarly, a line B-B' of FIG. 10(*b*) corresponds to one portion where the conductor 2*a* of the secondary winding 2 is located on the divided core 22, and the core cross section 20 of the divided core 22 at the line B-B' is referred to as core cross section 20-2 as shown in FIG. 11B. The magnetic material portion cross-sectional area 30 at the core cross section 20-2 is referred to as magnetic material portion cross-sectional area 30-2, and the non-magnetic material portion cross-sectional area 40 at the core cross section 20-2 is referred to as non-magnetic material portion cross-sectional area 40-2.

As can be seen from the comparison of the core cross sections of FIGS. 11A and 11B, a ratio of the magnetic material portion cross-sectional area 30-1 to the non-magnetic material portion cross-sectional area 40-1 at the core cross section 20-1 of the divided core 21 differs from a ratio of the magnetic material portion cross-sectional area 30-2 to the non-magnetic material portion cross-sectional area 40-2 at the core cross section 20-2 of the divided core 22.

As described above with reference to FIG. 3, in the divided core 21, the ratio of the magnetic material portion cross-sectional area 30-1 to the non-magnetic material portion cross-sectional area 40-1 is kept constant at each core cross section 20-1 corresponding to each wound conductor 2*a*. Similarly, in the divided core 22, the ratio of the magnetic material portion cross-sectional area 30-2 to the non-magnetic material portion cross-sectional area 40-2 is kept constant at each core cross section 20-2 corresponding to each wound conductor 2*a*.

Figure 12:
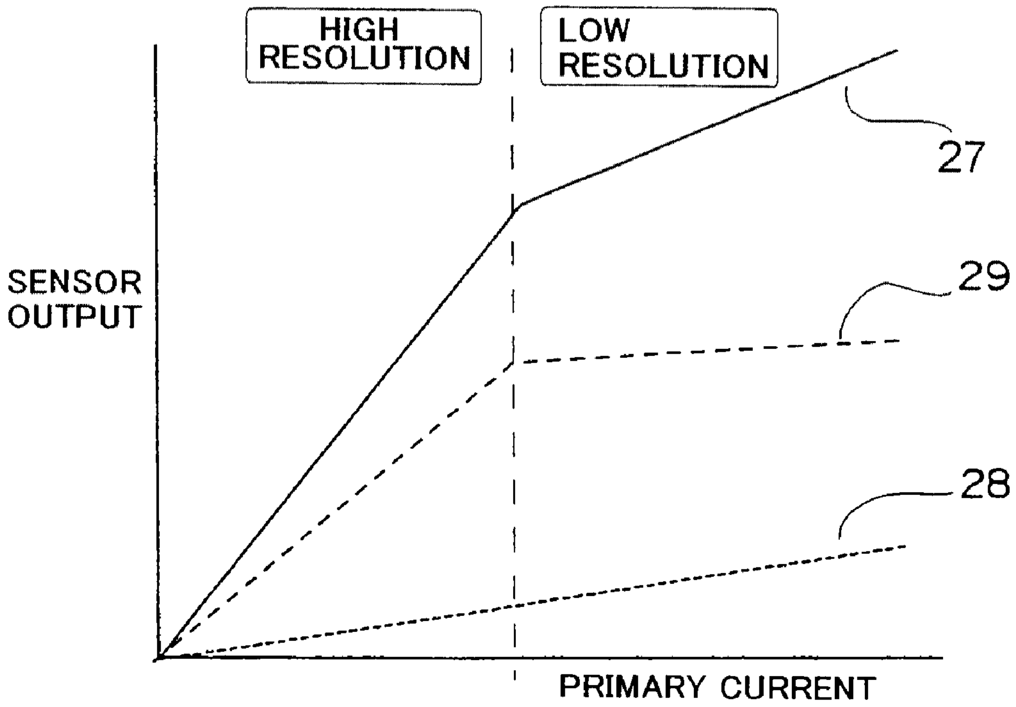
FIG. 12 is a graph showing sensitivity characteristics of the current sensor of FIG. 10.

FIG. 12 is a graph showing sensitivity characteristics of the core 23 formed by the constitution mentioned above.

In the divided core 22 in which the sensitivity is set higher, since the sensitivity is set higher with respect to the primary current passing through the primary conductor 5, a primary current in which a tendency of the magnetic saturation is actualized becomes smaller than that of the divided core 21 in which the sensitivity is set lower, and the sensitivity coefficient becomes small in a range not less than a primary current value where the influence of the magnetic saturation is actualized. As a result, the divided core 22 shows a characteristic such as an output characteristic 29 obtained only by the high-sensitivity setting magnetic material portion in which the change in sensor output becomes small with respect to the primary current.

On the other hand, in the divided core 21 in which the sensitivity is set lower, since the sensitivity is set lower with respect to the primary current, the primary current in which the tendency of the magnetic saturation is actualized is larger than that of the divided core 22 in which the sensitivity is set higher. As a result, the divided core 21 shows a characteristic such as an output characteristic 28 obtained only by the low-sensitivity setting magnetic material portion. However, when the primary current passing through the primary conductor 5 becomes larger, similarly to the divided core 22 in which the sensitivity is set higher, the divided core 21 in which the sensitivity is set lower also shows the tendency of the magnetic saturation.

The divided core 23 in which the divided cores 21 and 22 having the different sensitivity are brought together exhibits a sensor characteristic such as a combined output characteristic 27 in which the output characteristic 28 obtained only by the low-sensitivity setting magnetic material portion and the output characteristic 29 obtained only by the high-sensitivity setting magnetic material portion are overlapped in each other.

In the second embodiment, the two divided cores 21 and 22 having the different sensitivity are brought together to form the one core 23. The same effect can be obtained by bringing together at least three divided cores if needed.

Additionally, a divided core which is formed by only the magnetic material portion without providing the non-magnetic material portion can also be applied as a most sensitive divided core to the design of the sensor characteristic.

Thus, as described above, the plural divided cores having the different sensitivity are brought together to produce the one core 23, and the current sensor is produced with the core 23, so that the sensor characteristic having the sensitivity coefficient distribution can be designed according to the application.

Figure 13:
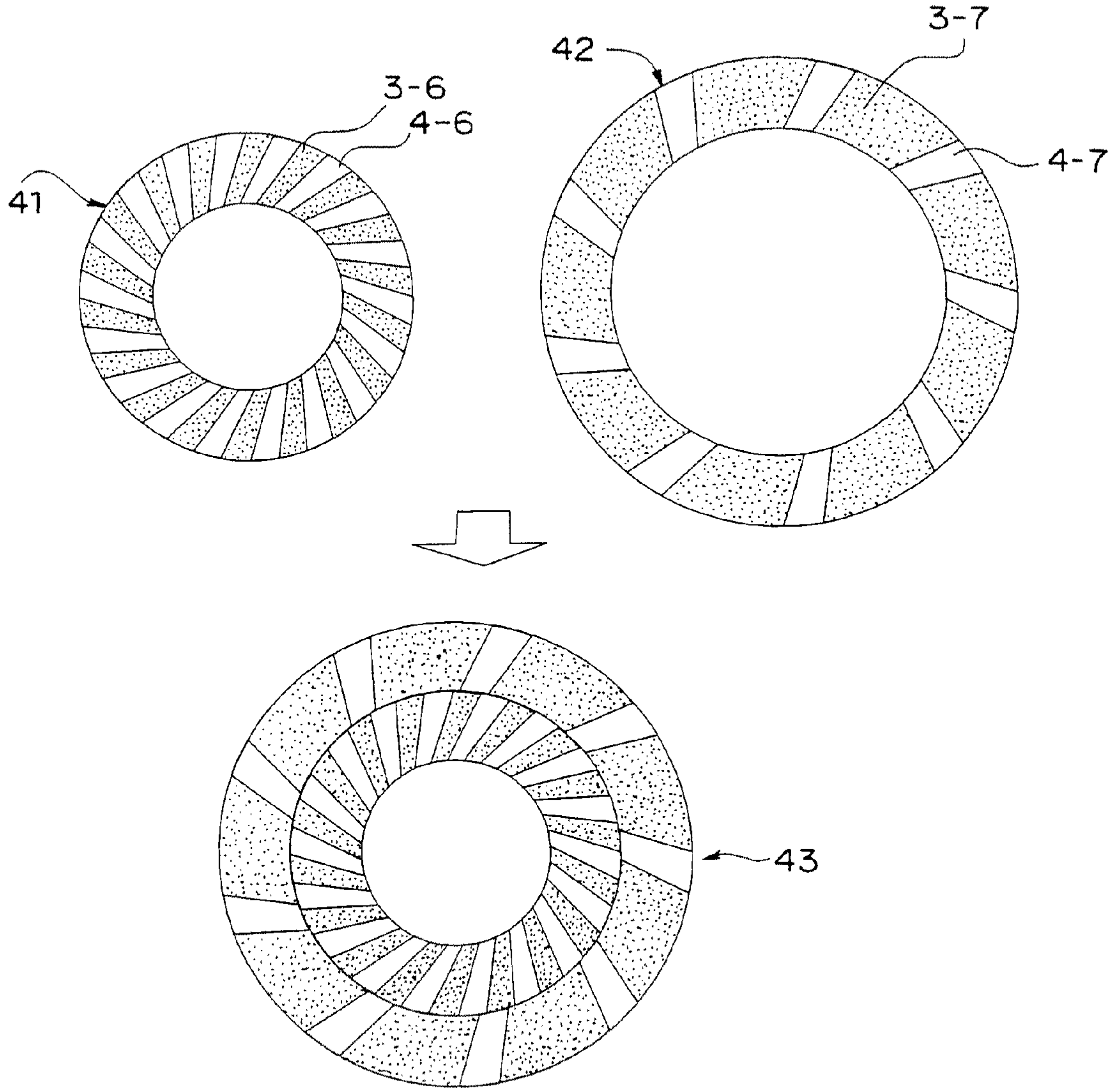
FIG. 13 is a plan view showing a core portion in a modification of the current sensor of FIG. 10.

In the second embodiment, the divided cores 21 and 22 are overlapped each other in the thickness direction of the divided cores 21 and 22. However, the method of combining the divided cores is not limited to the second embodiment. For example, as shown in FIG. 13, telescopic type divided cores 41 and 42 are formed by adjusting an inner diameter and an outer diameter of the divided cores, and the divided cores 41 and 42 may be united to form a core 43. In FIG. 13, the reference numerals 3-6 and 3-7 designate the magnetic material portion, and the reference numerals 4-6 and 4-7 designate the non-magnetic material portion. In the configuration of FIG. 13, advantageously a thickness of the combined core can be decreased. FIG. 13 shows the case in which the two divided cores 41 and 42 are united. Alternatively, at least three divided cores of the telescopic type may be united to form the one core.

In the second embodiment, the separately-produced divided cores are united. Alternatively, the same effect can be obtained, when various regions where the non-magnetic material portions are formed are formed in the one core to adjust the sensitivity coefficient by such as the cutting.

The characteristic of the sensor in which the one core is formed by the plural divided cores is effectively utilized as follows. That is, there is a case that, for example, high accuracy (high-resolution) measurement is performed in a range where the current is not more than a rated value, and the resolution is decreased to measure only a tendency of the current in a range where the current exceeds the rated value. In such cases, the current region to be measured with high accuracy can be allocated to a large portion of a measurement range (A/D range) of a measurement instrument.

Third Embodiment

A current sensor according to a third embodiment of the present invention will be described with reference to FIGS. 14 and 15. In the current sensor of the third embodiment, the current sensors of the first or second embodiment are produced by plating or a printed board having good shape controllability.

Figure 14:
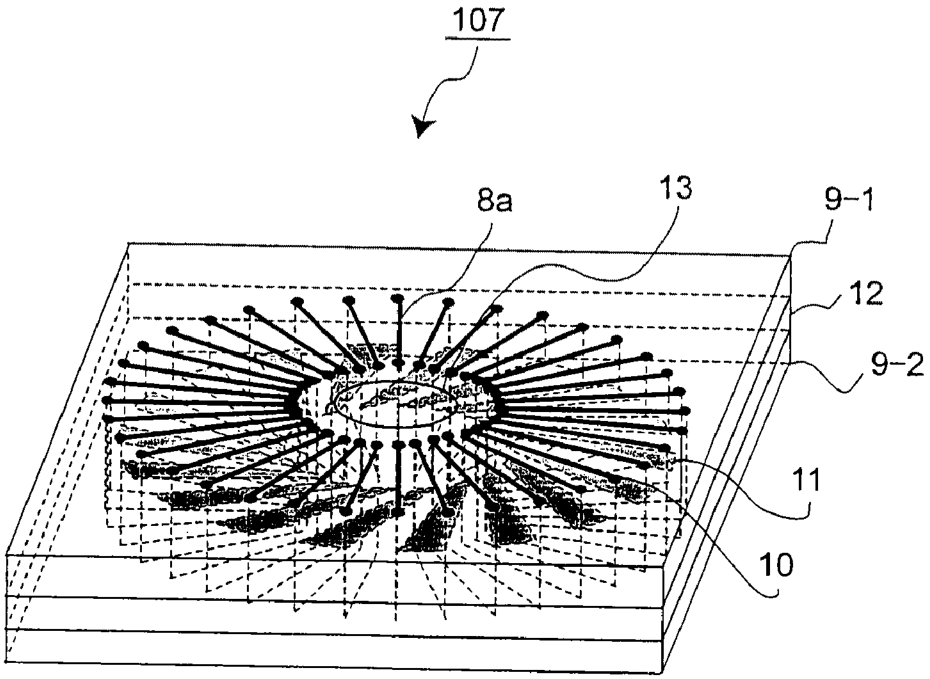
FIG. 14 shows a current sensor according to a third embodiment of the present invention.
Figure 15:
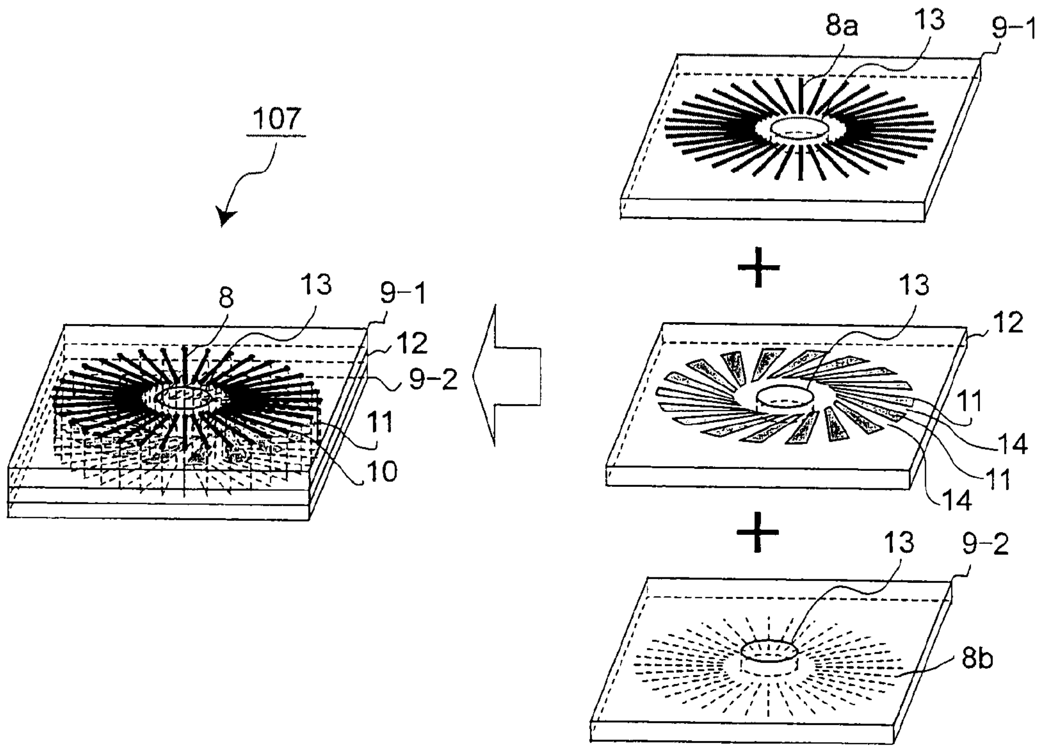
FIG. 15 shows a procedure for producing the current sensor of FIG. 14.

FIGS. 14 and 15 shows a current sensor 107 of the third embodiment in which the configuration of the current sensor 101 of FIG. 1 is produced with the board. Obviously the configurations of the current sensors 102 to 106 may be produced in the below-mentioned manner.

The current sensor 107 includes a first winding pattern board 9-1, a second winding pattern board 9-2, and a core pattern board 12 sandwiched between the winding pattern boards 9-1 and 9-2. In the first winding pattern board 9-1, a first conductor **8*a* is formed radially by the patterning on the board, such as the printed board, which is made of the non-magnetic material. The first conductor 8*a* is a conductor portion which corresponds to the conductor 2*a* extended on the upper and lower surfaces 1*a*-2 of the core 1, and is made of the conductive material. Therefore, as shown in FIGS. 14 and 15, the first conductor 8*a* is formed along the radial direction of a donut shape in a donut region in which the upper and lower surfaces 1*a*-2 are replicated. The second winding pattern board 9-2 is produced in the same way as the first winding pattern board 9-1. The conductor whose pattern is radially formed on the board 9-2 by the conductive material is referred to as second conductor 8*b***.

The core pattern board 12 is made of the non-magnetic material. The arrangement configuration of the magnetic material portion 3 and the non-magnetic material portion 4 on the upper and lower surfaces **1*a*-2 of the core 1 is imitated onto a board surface of the core pattern board 12. Namely, the core pattern board 12 is a board in which a core pattern of a magnetic material pattern 11 is spirally formed by, for example, electrolytic plating etc, the magnetic material pattern 11 corresponding to the magnetic material portion 3 of the core 1. Therefore, the magnetic material pattern 11 made of the magnetic material and a non-magnetic material portion 14 which is made of the non-magnetic material and is formed by the board surface of the core pattern board 12 are alternately arranged in the surface of the core pattern board 12. As mentioned later, since the magnetic material pattern 11 formed on the surface of the core pattern board 12 has the thickness although formed in the thin film, a recessed portion corresponding to the non-magnetic material portion 14 and sandwiched between the magnetic material patterns 11 is formed. Therefore, as mentioned below, when the core pattern board 12 is sandwiched between the winding pattern boards 9-1 and 9-2, a space of the recessed portion formed corresponding to the non-magnetic material portion 14 is filled with the non-magnetic material such as a bonding agent or remain of the air. This causes to form the non-magnetic material portion 14. Alternatively, a groove is formed in the core pattern board 12**, and the magnetic material may be provided in the groove to form the magnetic material pattern.

In the first winding pattern board 9-1, the second winding pattern board 9-2, and the core pattern board 12, the first conductor **8*a* and the second conductor 8*b* are aligned in the thickness direction of the board, the core pattern board 12 is sandwiched between the first winding pattern board 9-1 and the second winding pattern board 9-2, and the first winding pattern board 9-1 and the second winding pattern board 9-2 are bonded. Then, a through-hole 13 is made to dispose the primary conductor 5 at the central portion of the first conductor 8*a*, second conductor 8*b*, and magnetic material pattern 11 while penetrating through the first winding pattern board 9-1, second winding pattern board 9-2, and core pattern board 12. Additionally, through-holes made at both end portions of each first conductor 8*a* are connected to both end portions of the corresponding each second conductor 8*b*. The through-holes penetrates through the first winding pattern board 9-1, second winding pattern board 9-2, and the core pattern board 12. In each through-hole, a connection conductor 10 which electrically connects the first conductor 8*a* and the second conductor 8*b*** is formed by the plating or filling of conductive material, and the like.

In the current sensor 107 having the above-described configuration, the secondary winding 2 is formed by the first conductor **8*a*, the connection conductor 10, and the second conductor 8*b*, and the core 1 is formed by the magnetic material pattern 11 and the non-magnetic material portion 14**.

The same effect as the current sensor 101 can also be obtained in the current sensor 107.

In the current sensor 107, the core is formed by the technique having the excellent shape controllability, such as the printed board and the plating. Therefore, production accuracy of a width (core width) of the magnetic material pattern 11 in the core 1, a gap distance which is of a width of the non-magnetic material portion 14, and the like can be enhanced to improve the measurement accuracy of the current sensor. Additionally, the core in which the magnetic material patterns 11 and the non-magnetic material portions 14 are arranged can easily be produced by the technique, such as the printed board and the plating, which has the excellent shape controllability.

Although only one core pattern board 12 is used in the third embodiment, the plural core pattern boards 12 may be laminated to form the core 1. In this case, accuracy of the formation of the magnetic material pattern 11 in each core pattern board 12 has an influence on the current sensor measurement accuracy. As described above, the magnetic material pattern 11 can be produced with high formation accuracy in the current sensor 107, so that the high measurement accuracy can be achieved in the current sensor 107.

Also, the first conductor **8*a* and the second conductor 8*b* are produced by the technique having the excellent shape controllability, so that the positions (such as an angle) of the first conductor 8*a* and second conductor 8*b*** can be produced with high accuracy.

Using a multi-layer board, the secondary winding is collectively formed by the first conductor **8*a* and the second conductor 8_b_, and the many divided cores are collectively formed by the magnetic material pattern 11 and the non-magnetic material portion 14**. Therefore, downsizing and cost reduction can be achieved in the current sensor.

In the third embodiment, since the thickness of the magnetic material pattern 11 is as thin as of hundreds micrometers, the core cross-sectional area becomes small. However, when the core material, that is, the material of the magnetic material pattern 11 is a material such as permalloy, because the permalloy has the permeability higher than that of the surrounding air by at least three digits, average density of the magnetic flux 6 passing through the core cross section 20 in the current sensor 107 becomes higher several times compared with that of an air-core coil. Therefore, the current sensor can be set at high sensitivity by properly selecting the material of the magnetic material pattern 11.

In the case where the plural core pattern boards 12 are laminated, the high sensitivity can be further achieved in the current sensor.

In the third embodiment, the through-hole 13 is made after the first winding pattern board 9-1, the secondary-winding pattern board 9-2, and the core pattern board 12 are bonded. Obviously boards in which the through-hole 13 is made in advance may be bonded.

An unnecessary portion of the board except for the pattern portion may be removed when the sizes of the first winding pattern board 9-1, second winding pattern board 9-2, and core pattern board 12 are large relative to the pattern portions of the first conductor 8_a_, second conductor 8_b_, and magnetic material pattern 11.

In the case where the magnetic material pattern 11 is formed on the core pattern board 12 by the electrolytic plating, pattern shape and lead lines are formed on the core pattern board 12 by a general printed board technique. The core pattern board 12 is dipped in a plating solution in which metallic ions are solved, and a voltage is applied between electrodes, thereby forming the magnetic material pattern 11 made of the ferromagnetic film according to the pattern shape. Since the pattern shape is formed by the general printed board technique, the size of the pattern shape can be obtained with high accuracy. The shape of the magnetic material pattern 11 can also be formed with high accuracy because the magnetic material pattern 11 is plated on the electrode of the pattern shape.

Figure 16:
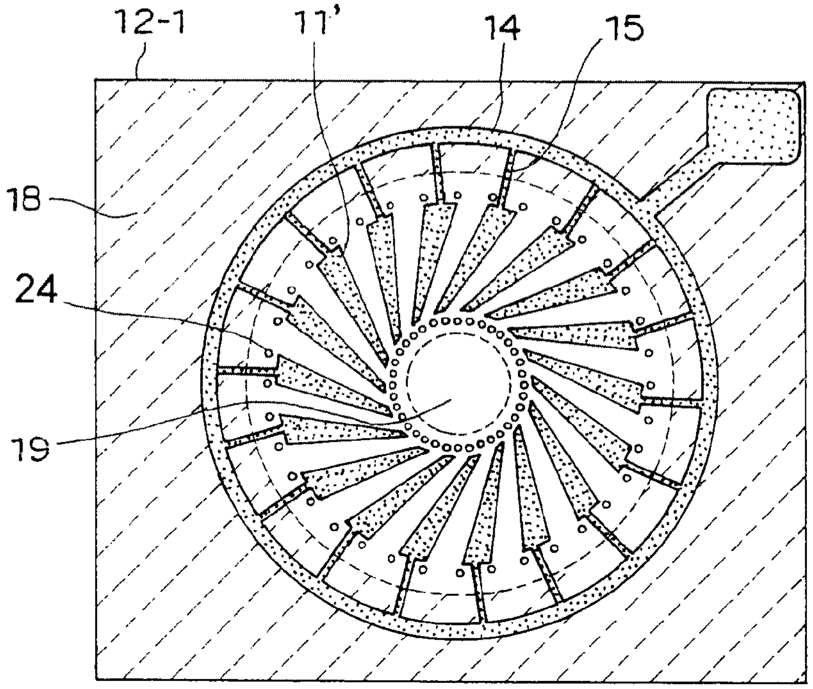
FIG. 16 shows a drawing for explaining a method of producing the current sensor of FIG. 1.

However, for the electrolytic plating, in a core pattern board 12-1 which corresponds to the core pattern board 12 and shows a state of immediately after the electrolytic plating as shown in FIG. 16, it is necessary that all electrode patterns 11' for forming the magnetic material patterns 11 is connected. Therefore, since the magnetic material patterns 11' immediately after the electrolytic plating are connected by a coupling portion 14, it is necessary to remove the coupling portion 14 in order to form only the magnetic material patterns 11. For example, a method of removing the coupling portion 14 can be cited as follow. The coupling portion 14 is formed at a removal portion 18 which is removed from the core pattern board 12 as an unnecessary portion, or the coupling portion 14 is formed at a removal portion 19 which is removed as the through-hole 13 through which the primary conductor 5 penetrates. According to such method, a process of solely removing the coupling portion 14 can be eliminated.

Figure 17:
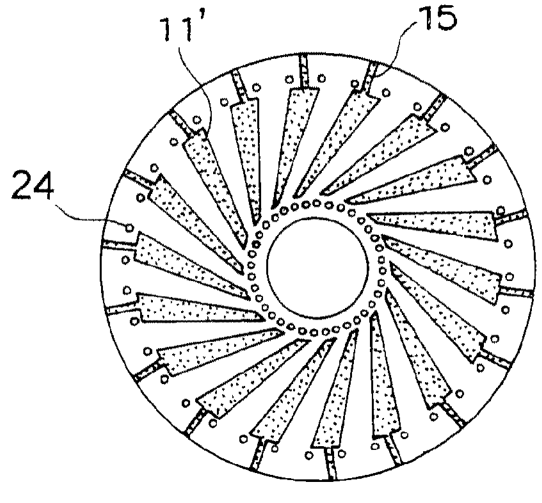
FIG. 17 is a plan view showing a core pattern board after the state of FIG. 16.

Even if the coupling portion 14 is removed, electrode lead lines 15 still remain in the magnetic material pattern 11. However, there is no trouble when the electrode lead lines 15 are located outside through-hole position 24 coupling the first conductor 8_a_ constituting the secondary winding 2. Even if the electrode lead lines 15 are located inside through-hole position 24, the electrode lead line 15 has a small influence when the electrode lead line 15 is substantially parallel to the first conductor 8_a_. Therefore, as shown in FIG. 17, it is not always necessary to remove the electrode lead lines 15.

Fourth Embodiment

Several methods of producing the current sensor 101 of the first embodiment will be described with reference to FIGS. 18 to 21.

Figure 18:
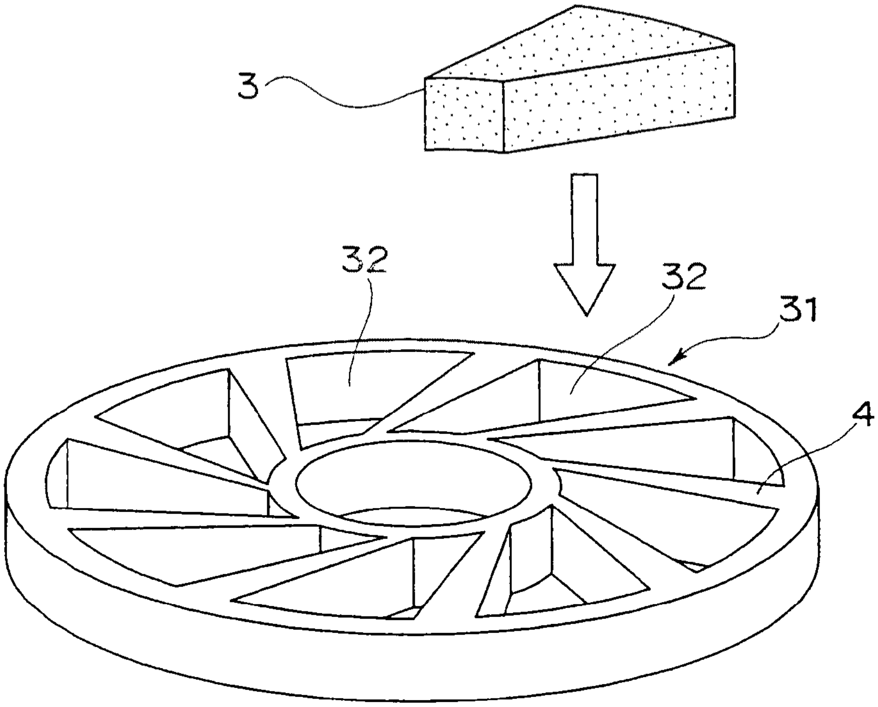
FIG. 18 shows a drawing for explaining another method of producing the current sensor of FIG. 1.

In the current sensor 101 of the first embodiment, since the magnetic material portions 3 are completely separated from one another by the non-magnetic material portions 4, it is difficult that the core 1 is formed while positional relationship among the magnetic material portions 3 is kept constant. Therefore, a core retaining case 31 is produced as shown in FIG. 18. Namely, even if the non-magnetic material portions 4 are coupled to one another, it causes no trouble. Using this feature, the core retaining case 31 is formed into a shape that the non-magnetic material portions 4 are coupled and the core retaining case 31 can also be used as the non-magnetic material portion 4. Therefore, the core retaining case 31 includes a fitting portion 32 formed into the shape corresponding to the magnetic material portion 3. The separately-produced magnetic material portion 3 is fitted into the fitting portion 32 to produce the core 1. It is enough to form the magnetic material portion 3 so that it can be fitted into the fitting portion 32. Thus various methods such as pressing and sintering can be adopted to produce the fitting portion 32.

Figure 19:
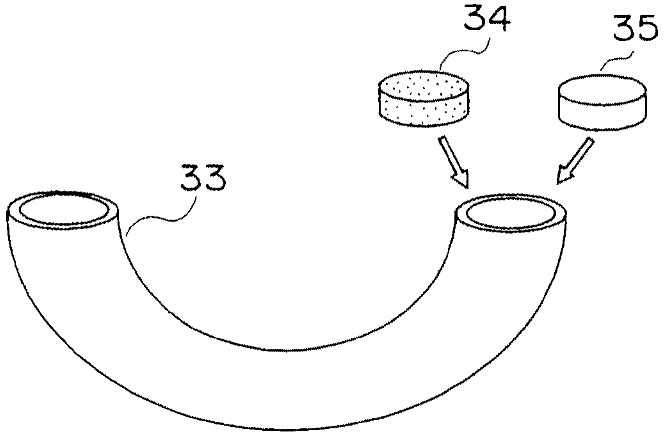
FIG. 19 shows a drawing for explaining still another method of producing the current sensor of FIG. 1.

As shown in FIG. 19, a method may be adopted that magnetic material portions 34 corresponding to the magnetic material portions 3 and non-magnetic material portions 35 corresponding to the non-magnetic material portions 4 are alternately inserted into a storage case 33 having a semicircular pipe shape. The two storage cases 33 which are filled with the magnetic material portions 34 and the non-magnetic material portions 35 are bonded to form the core 1, and the secondary winding 2 is wound around the bonded storage cases 33 to produce the current sensor 101.

Thicknesses of the magnetic material portion 34 and non-magnetic material portion 35 are determined according to the desired sensitivity of the current sensor. In a case where the thicknesses of the one magnetic material portion 34 and one non-magnetic material portion 35 are increased due to the sensitivity adjustment and hardly inserted into the storage case 33, each magnetic material portion 34 and each non-magnetic material portion 35 can be produced by laminating the thin magnetic material portions 34 and thin non-magnetic material portions 35 respectively.

Figure 20:
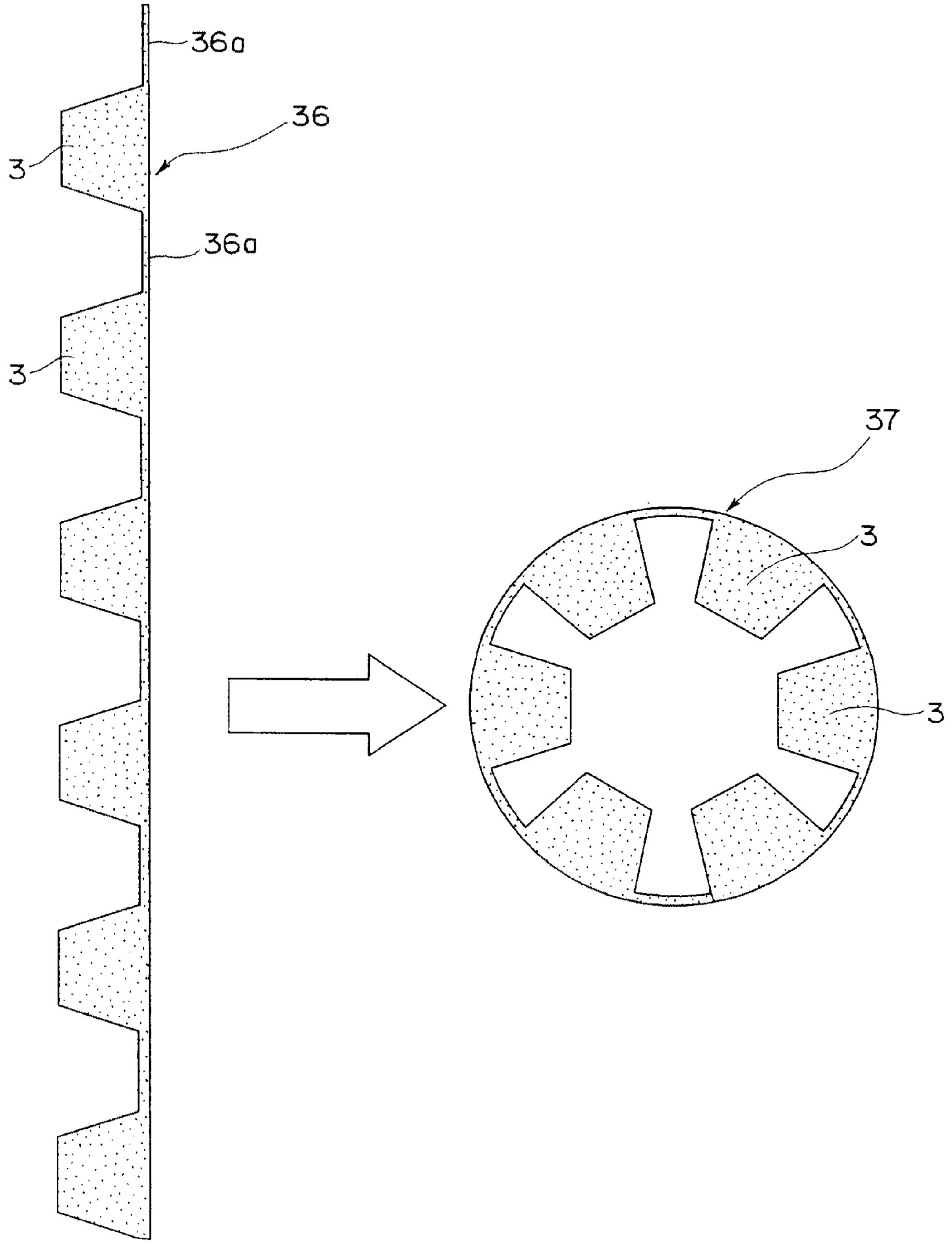
FIG. 20 shows a drawing for explaining still another method of producing the current sensor of FIG. 1.

Further, a method shown in FIG. 20 can be adopted. The plural magnetic material portions 3 made of magnetic materials are coupled to for a linear core forming member 36 by coupling portions 36_a_. Then, the linear core forming member 36 is deformed into an annular shape such that the magnetic material portions 3 located at both end portions of the core forming member 36 are coupled to the coupling portion 36_a_, thereby forming a core base member 37 which is of a base of the core 1.

Figure 21:
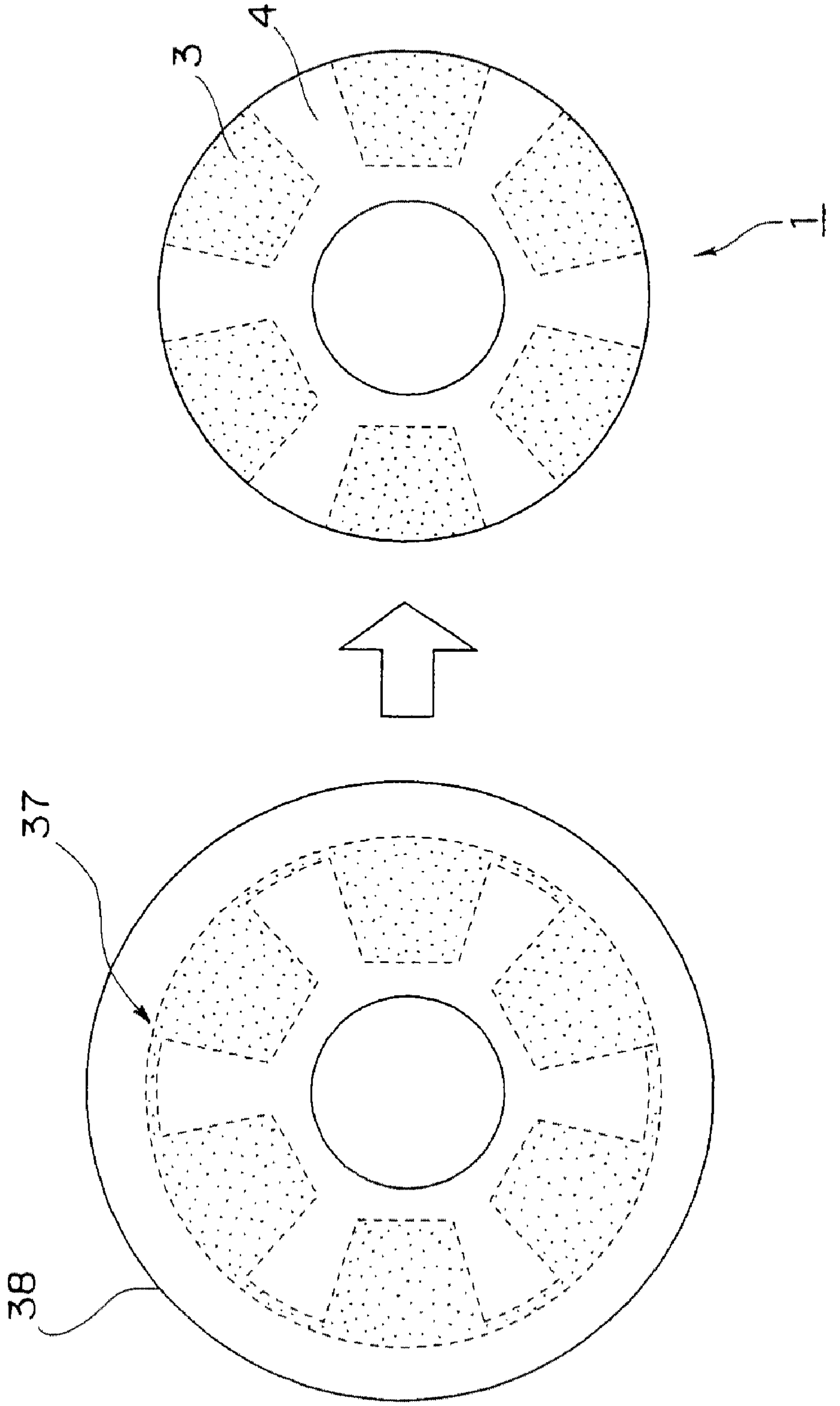
FIG. 21 is a plan view showing the core after the state of FIG. 20.

Then, as shown in FIG. 21, the core base member 37 is loaded into a die 38, and the die 38 is filled with a non-magnetic material to mold the core base member 37. Through this molding process, while the non-magnetic material portion 4 is formed between the magnetic material portions 3, the magnetic material portion 3 and the non-magnetic material portion 4 are united.

Alternatively, the core may be formed by adopting not the molding technique but the divided core technique described in the second embodiment. That is, a non-magnetic material portion member, which is made of the non-magnetic material and forms the non-magnetic material portion 4 and into which the core base member 37 can be fitted, is prepared. Then, by combining the non-magnetic material portion member and the core base member 37, the same product as the core in the molded state as mentioned above can be obtained.

Next, as shown in FIG. 21, the coupling portion 36*a* included in the core base member 37 is removed from the united magnetic material portion 3 and non-magnetic material portion 4 by cutting, thereby forming the core 1.

According to the above-described production method, both the alignment operation and the fixing operation of the completely-separated magnetic material portions 3 can easily be achieved.

Although the core base member 37 is formed into the circular shape in the fourth embodiment, the core base member 37 may be formed into a rectangular shape. The core is not limited to the circular shape in not only the first embodiment but the second and third embodiments.

The core forming member 36 in which the plural magnetic material portion 3 made of the magnetic material are formed is used in the fourth embodiment. Alternatively, a linear non-magnetic material portion forming member in which the plural non-magnetic material portions 4 made of a non-magnetic material are formed may be manufactured and used. However, in this case, from the viewpoint of heat-resistant temperature of the non-magnetic material portion forming member, sometimes it is difficult or impossible that molding is performed using the magnetic member after the non-magnetic material portion forming member is deformed into the annular shape or the like. Therefore, the method as mentioned above with reference to FIG. 18 is adopted. Namely, the magnetic material portion 3 which can be fitted in the non-magnetic material portion forming member is previously produced, and the magnetic material portion 3 is fitted in the non-magnetic material portion forming member.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2008-106715 filed on Apr. 16, 2008, including specification, claims, and drawings are incorporated herein by reference in its entirety.

What is claimed is:

1. A current sensor which measures a primary current by an output of a secondary winding, comprising:

a core which has a penetration portion in a central portion thereof and collects magnetic flux generated by the primary current passing through a primary conductor, the primary conductor being disposed while penetrating through the central portion; and a secondary winding which is wound in a toroidal form around a body portion of the core and detects a change of the magnetic flux in the core, the core further including:

a plurality of magnetic material portions made of a magnetic material and configured to divide the core in a circumferential direction of the core; and a plurality of non-magnetic material portions made of a non-magnetic material and configured to divide the core in the circumferential direction of the core;

the magnetic material portions and the non-magnetic material portions being alternately arranged over a whole circumference of the core, and the secondary winding being wound around the body portion of the core under conditions in which each core cross section intersects the magnetic material portion and the non-magnetic material portion, each core cross section being of a cutting plane in the core and including a cut end surface of each conductor along a direction in which each conductor constituting the secondary winding is extended, and a ratio of a magnetic material portion cross-sectional area of the magnetic material portion to a non-magnetic material portion cross-sectional area of the non-magnetic material portion at the core cross section is kept constant in each core cross section.

2. The current sensor according to claim 1, wherein the core includes a plurality of divided cores having an identical shape and configured to form the core by overlapped mutually, the divided cores differ from each other in a ratio of the magnetic material portion cross-sectional area to the non-magnetic material portion cross-sectional area at the core cross section of the divided core, and the secondary winding is wound around the body portion of the core formed by overlapping the divided cores according to the conditions.

3. The current sensor according to claim 1, wherein the magnetic material portion in the core is formed on a core pattern board with a patterning, the core pattern board being made of the non-magnetic material and having a through-hole through which the primary conductor penetrates.

4. The current sensor according to claim 3, further comprising two or more core pattern boards in which the pattern of the magnetic material portion is formed, wherein the core is formed by laminating the core pattern boards.

5. The current sensor according to claim 3, wherein the pattern of the magnetic material portion is formed on the core pattern board by electrolytic plating.

6. The current sensor according to claim 1, wherein the conductor constituting the secondary winding is configured:

to be formed on a first winding pattern board with a patterning, the first winding pattern board made of the non-magnetic material and having a through-hole through which the primary conductor penetrates;

to be formed on a second winding pattern board with a patterning, the second winding pattern board made of the non-magnetic material, having the through-hole through which the primary conductor penetrates, and sandwiching the core between the first winding pattern board and the second winding pattern board; and to have a connection conductor which electrically connects a first conductor formed on the first winding pattern board and a second conductor formed on the second winding pattern board.

7. The current sensor according to claim 1, further comprising a turn-back conductor configured to be formed by turning back the secondary winding wound in the toroidal form around the body portion of the core, and provided at the body portion along a direction in which the turn-back conductor cancels an influence of an inclination of the secondary winding wound around the body portion with respect to the primary conductor.

8. The current sensor according to claim 1, wherein the non-magnetic material portion is formed by a non-magnetic material member in which a fitting portion is formed, the magnetic material portion being fitted in the fitting portion.

9. The current sensor according to claim 1, wherein the core is formed by deforming a linearly-formed non-magnetic material portion or a linearly-formed magnetic material portion into an annular shape.

10. The current sensor according to claim 9, wherein the core is formed by molding the circularly-deformed magnetic material portion with the non-magnetic material, the non-magnetic material portion being made of the non-magnetic material.

* * * * *